(12) United States Patent
Shenai-Khatkhate et al.

(10) Patent No.: US 7,722,720 B2
(45) Date of Patent: May 25, 2010

(54) DELIVERY DEVICE

(75) Inventors: Deodatta Vinayak Shenai-Khatkhate, Danvers, MA (US); Michael L. Timmons, Durham, NC (US); Charles J. Marsman, Wilbraham, MA (US); Egbert Woelk, North Andover, MA (US); Ronald L. DiCarlo, Jr., Danville, NH (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 1198 days.

(21) Appl. No.: 11/295,381

(22) Filed: Dec. 6, 2005

(65) Prior Publication Data

US 2006/0121198 A1 Jun. 8, 2006

Related U.S. Application Data

(60) Provisional application No. 60/634,136, filed on Dec. 8, 2004.

(51) Int. Cl.
*C23C 16/00* (2006.01)
*B01J 27/132* (2006.01)

(52) U.S. Cl. .................. 118/726; 118/715; 427/255.28; 502/224

(58) Field of Classification Search ............ 427/255.28; 502/224; 118/726
See application file for complete search history.

(56) References Cited

U.S. PATENT DOCUMENTS

| | | | |
|---|---|---|---|
| 4,506,815 A | 3/1985 | Melas et al. | |
| 4,704,988 A | 11/1987 | Mellet | |
| 4,916,828 A * | 4/1990 | Yamane et al. | 34/364 |
| 4,947,790 A | 8/1990 | Gartner et al. | |
| 5,377,429 A | 1/1995 | Sandhu et al. | |
| 5,553,395 A | 9/1996 | Wen et al. | |
| 5,603,169 A | 2/1997 | Kim | |
| 5,711,816 A | 1/1998 | Kirlin et al. | |
| 5,722,184 A | 3/1998 | Onoe et al. | |
| 5,755,885 A | 5/1998 | Mikoshiba et al. | |
| 5,989,305 A | 11/1999 | Ohsaki et al. | |
| 6,444,038 B1 | 9/2002 | Rangarajan et al. | |
| 6,607,785 B2 | 8/2003 | Timmons et al. | |
| 2002/0078894 A1 * | 6/2002 | Timmons et al. | 118/726 |

FOREIGN PATENT DOCUMENTS

| | | |
|---|---|---|
| EP | 1 160 355 | 12/2001 |
| JP | 01055820 A2 | 3/1989 |
| JP | 2651530 B2 | 9/1997 |

OTHER PUBLICATIONS

Fannin et al.; "Cause and resolution of problem of erratic and decreasing trimethylindium bubbler delivery rates"; Journal of Crystal Growth 124 (1992) pp. 307-310.
European Search Report of corresponding European Application No. 05 25 7531 mailed Apr. 6, 2006.

* cited by examiner

*Primary Examiner*—Michael Cleveland
*Assistant Examiner*—Nathan K Ford
(74) *Attorney, Agent, or Firm*—S. Matthew Cairns (57) ABSTRACT

Delivery devices for delivering solid precursor compounds in the vapor phase to reactors are provided. Such devices include a precursor composition of a solid precursor compound with a layer of packing material disposed thereon. Also provided are methods for transporting a carrier gas saturated with the precursor compound for delivery into such CVD reactors.

13 Claims, 5 Drawing Sheets

DELIVERY DEVICE

This application claims the benefit of U.S. provisional application Ser. No. 60/634,136, filed on Dec. 8, 2004.

The present invention relates generally to a vapor generator system for use in vapor deposition equipment. In particular, the present invention relates to a vapor generator system designed for the requirements of vapor phase epitaxy and other chemical vapor deposition equipment.

Group III-V compound semiconductor materials including different monocrystalline layers with varying compositions and with thickness ranging from fractions of a micrometer to a few micrometers are used in the production of many electronic and optoelectronic devices such as lasers, LEDS and photodetectors. Chemical vapor deposition ("CVD") methods using organometallic compounds are typically employed for the deposition of metal thin-films or semiconductor thin-films, such as films of Group III-V compounds. Such organometallic compounds may be either liquid or solid.

In CVD methods, a reactive gas stream is typically delivered to a reactor to deposit the desired film. The reactive gas stream is typically composed of a carrier gas, such as hydrogen, saturated with precursor compound vapor. When the precursor compound is a liquid, a reactive gas stream is typically obtained by passing (i.e. bubbling) a carrier gas through the liquid precursor compound in a delivery device (i.e. a bubbler). Typically, solid precursors are placed in a cylindrical vessel or container and subjected to a constant temperature to vaporize the solid precursor. A carrier gas is employed to pick up the precursor compound vapor and transport it to a deposition system. Most solid precursors exhibit poor and erratic delivery rates when used in conventional bubbler-type precursor delivery vessels. Such conventional bubbler systems can result in a non-stable, non-uniform flow rate of the precursor vapors, especially when solid organometallic precursor compounds are used. Non-uniform organometallic vapor phase concentrations produce an adverse effect on the compositions of the films, particularly semiconductor films, being grown in metalorganic vapor phase epitaxy ("MOVPE") reactors.

Delivery devices have been developed that attempt to address the problems of delivering solid precursor compounds to a reactor. While some of these delivery devices were found to provide a uniform flow rate, they failed to provide a consistently high concentration of precursor material. The inability to achieve a stable supply of feed vapor from solid precursors at a consistently high concentration is problematic to the users of such equipment, particularly in semiconductor device manufacture. The unsteady precursor flow rate can be due to a variety of factors including progressive reduction in the total surface area of chemical from which evaporation takes place, channeling through the solid precursor compound and the sublimation of the precursor solid material to parts of the delivery system where efficient contact with the carrier gas is difficult or impossible. When a channel develops through a bed of solid precursor compound the carrier gas will preferentially flow through such channel rather than through the bed of precursor compound resulting in reduced contact of the carrier gas and precursor compound. Such channeling causes a decrease in the vapor phase concentration of solid precursor compound and results in unused solid precursor compound remaining in the delivery device.

Higher carrier gas flow rates give higher transportation rates of precursor compound to the vapor phase reactor. Such higher flow rates are needed to grow thicker films in less time. For example, in certain applications the growth rate is increasing from 2.5 μm/hour to 10 μm/hour. In general, the use of higher carrier gas flow rates with solid precursor compounds is detrimental to maintaining a stable concentration of the precursor compound in the gas phase. Accordingly, there is a need for improved systems for delivering solid precursor compounds in the vapor phase to a vapor phase reactor at higher flow rates than provided by conventional solid precursor delivery systems.

Japanese Patent No. 06-020051 B (assigned to Ube Industries) discloses a method of charging a delivery cylinder for solid organometallic compounds by charging a metallic filler into a cylinder and charging an organometallic compound on the surface of the metallic filler by sublimation. Another layer of metallic filler is placed on the organometallic compound. The cylinders disclosed in this patent contain a dip tube and have a three-layer system of an organometallic compound sandwiched between two metallic filler layers, the dip-tube passing through the top metallic filler layer and the organometallic compound layer and ending in the bottom layer of metallic filler. This approach is not without problems as certain metallic fillers used in conjunction with highly reactive organometallic compounds increase the probability of generating deleterious metallic impurities in situ which are able to be transported in the vapor phase along with the desired organometallic compound. Certain metals, such as nickel and chromium, are known to enhance the decomposition of Group III organometallic compounds.

Conventional approaches to delivering a solid precursor compound in the vapor phase do not adequately provide a uniform and high concentration of precursor vapor throughout the process up to depletion of the solid precursor compound from the delivery device. There remains a need for improved delivery devices and methods for delivering a vapor of solid precursor compound where the solid precursor compound is depleted from the delivery device and where the vapor concentration of the solid precursor compound remains uniform and at a sufficiently high concentration.

It has been found that a vapor phase delivery device including a precursor composition including a solid precursor compound and a layer of a packing material on the solid precursor compound provides a more consistent, stable concentration of precursor compound in the vapor phase even at high flow rates, low pressures or a combination of high flow rates and low pressures as compared to the same system without such packing material. Such composition including a solid precursor compound having a layer of packing material thereon is particularly suitable for use with dual-chambered delivery devices. Such consistent, stable concentration of precursor in the vapor phase can be achieved without the need to heat the solid precursor compound at or near its decomposition temperature.

The present invention provides a vapor phase delivery device for solid precursor compounds including an outlet chamber and an inlet chamber including a precursor composition including a solid precursor compound and a layer of packing material disposed on the solid precursor compound. In one embodiment, the delivery device does not contain a dip-tube. A "dip-tube" is used in a cylinder having a single chamber and is a tube that directs the carrier gas through the precursor compound and delivers the carrier gas to a bottom portion of the precursor compound, whereby the carrier gas then travels upward through the precursor compound.

Delivery devices including a precursor composition including a solid precursor compound and a packing material, wherein the packing material includes a stabilizing agent are provided. In one embodiment, the solid precursor compound is an organometallic compound.

Also provided by the present invention is a method of depositing a film including: a) providing the delivery device described above, wherein the delivery device has a gas inlet and a gas outlet; b) introducing a carrier gas into the delivery device through the gas inlet; c) flowing the carrier gas through the packing material and the solid precursor compound to substantially saturate the carrier gas with the precursor compound; d) the precursor compound saturated carrier gas exiting from the delivery device through the gas outlet; e) delivering the precursor compound saturated carrier gas to a reaction vessel containing a substrate; and f) subjecting the precursor compound saturated carrier gas to conditions sufficient to decompose the precursor compound to form a film on the substrate.

As used throughout this specification, the following abbreviations shall have the following meanings, unless the context clearly indicates otherwise: ° C.=degrees centigrade; sccm=standard cubic centimeter per minute; cm=centimeter; mm=millimeter; μm=micron=micrometer; g=gram; kPa=kilopascals; PTFE=polytetrafluoroethylene; HDPE=high density polyethylene; and TMI=trimethyl indium.

The indefinite articles "a" and "an" include both the singular and the plural. "Halogen" refers to fluorine, chlorine, bromine and iodine and "halo" refers to fluoro, chloro, bromo and iodo. Likewise, "halogenated" refers to fluorinated, chlorinated, brominated and iodinated. "Alkyl" includes linear, branched and cyclic alkyl. As used herein, the term "precursor compound" refers to any solid compound that provides a vapor phase concentration of a component used in the growth of a film on a substrate. All numerical ranges are inclusive and combinable in any order except where it is clear that such numerical ranges are constrained to add up to 100%.

The vapor generator or delivery device of the present invention is designed to eliminate poor and erratic delivery rates exhibited by known designs as well as their inability to provide complete uniform depletion of the solid precursor compound. A wide variety of delivery devices may benefit from the present invention. The delivery device is typically a dual-chambered device that includes an outlet chamber and an inlet chamber, the inlet chamber including a precursor composition that includes a solid precursor compound and a layer of packing material disposed on the solid precursor compound. The inlet chamber communicates with the outlet chamber. In one embodiment, the inlet chamber communicates with the outlet chamber through a porous element. In a further embodiment, the porous element is in a floor of the inlet chamber.

One type of useful delivery device is that having a dual-chambered configuration where a porous element separates the first chamber (typically an inlet chamber) from the second chamber (typically an outlet chamber or outlet tube). In one embodiment, suitable dual-chambered delivery devices are those having an elongated cylindrical shaped portion having an inner surface defining a substantially constant cross-section throughout the length of the cylindrical portion, a top closure portion, a bottom closure portion, and inlet and outlet chambers in fluid communication and separated by a porous element, the top closure portion having a fill plug and a gas inlet opening, the fill plug and gas inlet opening communicating with the inlet chamber, an outlet opening communicating with the outlet chamber, the porous element being spaced from the bottom closure portion, the porous element contained in a floor of the inlet chamber. In such dual-chambered vessels, the precursor composition is contained within the inlet chamber.

In another embodiment, the inlet chamber further includes a conical-shaped lower portion which contains the porous element. In a further embodiment, the conical-shaped lower portion decreases in cross-section toward the porous element. In a yet further embodiment, the porous element forms the floor of the conical-shaped lower portion. In a still further embodiment, the inlet chamber and outlet chamber are concentric. When the inlet and outlet chambers are concentric, the inlet chamber may be contained within the outlet chamber or the outlet chamber may be contained within the inlet chamber. In yet another embodiment, the outlet chamber may contain a second porous element, such as located at the gas outlet opening, such that the gas exits the vessel by passing through the porous element. In still another embodiment, the inlet chamber may contain a second porous element, such as located at the gas inlet opening, such that the gas enters the inlet chamber by passing through the porous element. It will be appreciated by those skilled in the art that other suitable delivery devices may be used.

These delivery devices (or cylinders) may be constructed of any suitable material, such as glass, PTFE and metal, as long as the material is inert to the precursor compound contained therein and able to withstand the temperature and pressure conditions during use. Typically, the cylinder is constructed of a metal. Exemplary metals include, without limitation, nickel alloys and stainless steels. Suitable stainless steels include, but are not limited to, 304, 304 L, 316, 316 L, 321, 347 and 430. Exemplary nickel alloys include without limitation INCONEL, MONEL, and HASTELLOY. It will be appreciated by those skilled in the art that a mixture of materials may be used in the manufacture of such cylinders.

The porous element is typically a frit having a controlled porosity. Porous elements having a wide variety of porosities may be used in the present invention. The particular porosity will depend upon a variety of factors well within the ability of those skilled in the art. Typically, the porous element has a pore size of from 1 to 100 μm, more typically from 1 to 10 μm. However, porous elements having porosities greater than 100 μm may be suitable for certain applications. Likewise, porous elements having porosities less than 1 μm may be suitable for certain applications. Any material may be used to construct the porous element provided it is inert to the organometallic compound used under the conditions employed and the desired porosity can be controlled. Suitable materials for forming the porous element include, but are not limited to, glass, PTFE and metals such as stainless steels and nickel alloys. Any of the above described stainless steels and nickel alloys may suitably be used. Typically, the porous element is a sintered metal, and more typically stainless steel. It will be appreciated by those skilled in the art that the porous element separating the inlet and outlet chambers may be the same as or different from any other porous element located at the gas inlet opening, the gas outlet opening or both the gas inlet and outlet openings. Likewise, the different porous elements may have the same or different pore sizes.

The porous element may compose a portion of the floor or the entire floor of the inlet chamber. When the inlet chamber further includes a conical-shaped lower portion, the porous element is typically contained within such conical-shaped section. Typically, the porous element forms the floor of the conical-shaped lower portion.

The porous element retains the precursor composition in the inlet chamber as well as the packing material. In cylinders having an inlet chamber with a generally conical-shaped section, the combination of such conical-shaped section and porous element provides a restriction for the gas flow. This restriction affords uniform carrier gas flow through the solid precursor compound/packing material layers. The conical-shaped section enhances the movement of the solid precursor compound/packing material layered composition within the cylinder and directs the solid precursor compound onto the porous element surface. This is particularly important towards the end of the cylinder life and improves the yield (i.e. the amount of precursor compound delivered to the reaction chamber) from the cylinder. The generally conical-shaped section of the lower portion of the inlet chamber may be of any angle, such as from 1 to 89 degrees, as measured from the plane of the floor of the inlet chamber. Typically, the conical section has an angle of 20 to 60 degrees.

The size of the porous element is not critical. In general, a porous element in the floor of the inlet chamber may have any suitable size up to the diameter of the inlet chamber. For example, the porous element may be a disk having a diameter of 1 cm (0.4 inches) or greater, such as 1.25 cm (0.5 inches), 1.9 cm (0.75 inches), 2.54 cm (1 inch), 3.8 cm (1.5 inches), 5 cm (2 inches) or greater. The porous element may have a variety of thicknesses, such as 0.3 cm (0.125 inches) or greater, such as 0.6 cm (0.25 inches), 1.25 cm (0.5 inches) or greater. The dimension of such porous element is well within the ability of those skilled in the art. In an alternative embodiment, the porous element may have an inner tube concentric with its outer diameter.

The cross-sectional dimension of the delivery device (cylinder) may vary over a wide range. However, the cross-sectional dimension is generally critical to the performance of the cylinder for a given application, otherwise the dimensions of the cylinder are not critical and are dependent upon, among others, the carrier gas flow, the solid precursor compound to be used, and the particular chemical vapor deposition system used. The cross-sectional dimension affects heat transfer and determines, at a given pressure and flow rate, the linear velocity of the gas in the cylinder, which in turn controls the contact time between the solid precursor compound and carrier gas and thus saturation of the carrier gas. Typically, the cylinder has a cross-sectional dimension (diameter) of 5 cm (2 inches) to 15 cm (6 inches), and more typically 5 cm, 7.5 cm (3 inches) or 10 cm (4 inches). The other dimensions for a particular cylinder are well within the ability of those skilled in the art. Suitable cylinders as those marketed by Rohm and Haas Electronic Materials LLC (Marlborough, Mass.).

A solid precursor compound is contained within the inlet chamber. Such solid precursor compound is the source of precursor compound vapor. Any solid precursor compound suitable for use in vapor delivery systems may be used in the present invention. Suitable precursor compounds include, without limitation: indium compounds, zinc compounds, magnesium compounds, aluminum compounds, and gallium compounds. Exemplary precursor compounds include, without limitation: trialkyl indium compounds such as trimethyl indium and tritertiarybutyl indium; trialkyl indium-amine adducts; dialkyl haloindium compounds such as dimethyl chloroindium; alkyl dihaloindium compounds such as methyl dichloroindium; cyclopentadienyl indium; trialkyl indium-trialkyl arsine adducts such as trimethyl indium-trimethyl arsine adduct; trialkyl indium-trialkyl-phosphine adducts such as trimethyl indium-trimethyl phosphine adduct; alkyl zinc halides such as ethyl zinc iodide; cyclopentadienyl zinc; ethylcyclopentadienyl zinc; alane-amine adducts; alkyl dihaloaluminum compounds such as methyl dichloroaluminum; alkyl dihalogallium compounds such as methyl dichlorogallium; dialkyl halogallium compounds such as dimethyl chlorogallium and dimethyl bromogallium; biscyclopentadienyl magnesium ("$Cp_2Mg$"); carbon tetrabromide; metal beta-diketonates, such as beta-diketonates of hafnium, zirconium, tantalum and titanium; metal dialkylamido compounds such as tetrakis(dimethylamino)hafnium; silicon compounds and germanium compounds such as bis(bis(trimethylsilyl)amino) germanium. In the above precursor compounds, the term "alkyl" refers to ($C_1$-$C_6$)alkyl. Mixtures of precursor compounds may be used in the present delivery devices.

Optionally, the solid precursor compound may be fritted. As used herein, "fritting" refers to the fusing of the solid precursor compound. It has been found that a frit of solid precursor compound in a cylinder enables a more consistent, stable concentration of precursor compound in the vapor phase and provides better depletion of the solid precursor compound from the cylinder as compared conventional techniques. A "frit of solid precursor compound" refers to a fused cake of solid precursor compound having a substantially level top surface and sufficient porosity to allow the carrier gas to pass through the cake. In general, when the frit of solid precursor compound is first formed, it conforms to the internal dimensions of the cylinder, that is, the frit has a width substantially equal to the interior dimension of the inlet chamber. The height of the frit will depend upon the amount of solid precursor compound used.

Fritting is typically accomplished by subjecting the solid precursor compound to conditions that provide a frit of the solid precursor compound having a substantially level surface. Typically, the solid precursor compound is first added to the cylinder (e.g., to the inlet chamber), the cylinder is agitated to provide the solid precursor compound with a substantially level surface, the solid precursor compound is then fritted to form a frit of the solid precursor compound. Such fritting step may optionally be performed with heating and is preferably performed with heating. In another embodiment, the agitation step may be performed with heating. Agitation may be performed by any suitable means, such as, but not limited to, tapping, vibrating, rotating, oscillating, rocking, stirring, pressurizing, vibrating by electrostrictive or magnetostrictive transducers, or shaking the cylinder to provide a level top surface of the precursor compound. Combinations of such agitation methods may be used.

The heating step is performed at a temperature below the decomposition temperature of the solid precursor compound. Typically, the heating step is performed at a temperature of up to 5° C. below the decomposition temperature of the solid precursor compound, and more typically up to 10° C. below the decomposition temperature of the solid precursor compound. For example, TMI may be fritted at a temperature of 35-50° C. Such controlled heating may be performed using a water bath, an oil bath, hot air, a heating mantle and the like. The fritting step is performed for a period of time sufficient to fuse the solid precursor compound into a frit. The time used for the fritting step depends on the particular solid precursor compound used, the amount of the solid precursor compound, and the particular temperature used, among other factors. Alternatively, the fritting step may be performed under reduced pressure.

The particular porosity of the precursor compound frit depends upon the fritting temperature used, the particular precursor compound used and the starting particle size of the precursor compound, among other factors. Smaller particles of solid precursor compound will typically provide a frit having smaller pores as compared to a frit formed from larger particles of the same solid precursor compound. As used herein, "pore" refers to the space between particles of fused solid precursor compound.

A desired particle size of the solid precursor compound may be obtained by a variety of methods, such as, but not limited to, crystallization, grinding, and sieving. The solid precursor compound may be dissolved in a solvent and crystallized by cooling, by the addition of a non-solvent or by both to provide the desired particles. Grinding may be performed manually, such as with a mortar and pestle, or by machine such as using a grinding mill. Particles of the solid precursor compound may be sieved to provide solid precursor compound having a substantially uniform particle size. Combinations of such methods may be employed to obtain precursor compound in the desired particle size. In an alternative embodiment, solid precursor compound having particles having different particle sizes may be used. The use of such different particle sizes may provide a frit of the solid precursor compound having varying pore sizes.

In a further embodiment, the frit of the solid precursor compound may contain a porosity gradient, i.e., a gradient of pore sizes. Such pore size gradient may be obtained by fritting a gradient of particles of the solid precursor compound having varying sizes. Such gradient can be formed by sequentially adding particles of increasing (or decreasing) size to the cylinder; and agitating the cylinder to provide the solid precursor compound with a level surface; and fritting the solid precursor compound.

In yet another embodiment, the frit of the solid precursor compound may contain regions of different pore sizes. For example, the frit may contain a region having a relatively large pore size, e.g. 5 μm, and a region having a relatively small pore size, e.g. 2 μm. There may be one or more of each region. When there are more than one of each region, such regions may be alternating. Additionally, there may be one or more other regions having yet different pore sizes.

Pore sizes in the frit of solid precursor compound may also be controlled by using one or more of certain porosity forming aids, such as organic solvents or other removable agent. Any organic solvent that does not react with the precursor compound may be used. Typical organic solvents include, without limitation, aliphatic hydrocarbons, aromatic hydrocarbons, amines, esters, amides, and alcohols. Such organic solvents do not need to, but may, dissolve the solid precursor compound. In one embodiment, a slurry of the precursor compound and solvent is added to a cylinder. A substantially level surface of the slurry is formed. The solvent is then removed and the solid precursor compound is fritted. It will be appreciated by those skilled in the art that the solvent may be removed during the before, during or after the fritting step.

A wide variety of packing materials (filler) may be used in the present invention, provided that they are inert to the solid precursor compound and the cylinder under the conditions of use. Typically, the packing material is flowable. For example, as the precursor compound is depleted from the cylinder, the level of precursor compound in the cylinder will decrease and the packing material needs to flow such that it fills in any depressions in the surface of the precursor compound layer. Suitable packing materials include, without limitation, ceramics, glasses, clays and organic polymers. Exemplary packing materials include alumina, silica, silicon carbide, silicon nitride, borosilicates, and alumina silicates. Mixtures of different packing materials may also be used. In one embodiment, the packing material is not an elemental metal such as nickel or metal alloy such as stainless steel. Packing materials do include precursor compounds and other materials containing metals in combination with non-metal elements. In another embodiment, an organometallic compound used as the packing material may be the same as the precursor compound. For example, a solid precursor compound that is a powder may be compressed to form pellets. The pelletized precursor compound may be used as the packing material on a layer of the same precursor compound (that is not in pelletized form).

In another embodiment, packing materials offering additional advantages such as stabilizing agents, may be employed in the present invention, provided that they are inert to the solid precursor compound and the cylinder under the conditions of use. Exemplary stabilizing agents include without limitation oxygen scavengers (getters), thermal stabilizers, antioxidants, anti-static agents, free-radical scavengers, and tagging (marking) agents. Suitable getter material includes, without limitation, compounds and formulations containing compounds of oxygen reactive metals such as sodium, potassium, lithium, aluminum, indium, gallium, manganese, cobalt, copper, barium, calcium, lanthanum, thorium, magnesium, chromium and zirconium. In one embodiment, the stabilizing agent is a member of the class of ionic salts that are non-polar and non-volatile such as tetraorganylammonium compounds mixed with organoaluminums; salts of aluminum, indium and gallium; organolithiums; metallocenes of magnesium, zirconium, and lanthanum; metal beta-diketonates including dipivaloylmethanato ("dpm") compounds of aluminum, indium, gallium, barium, strontium and copper and hexafluoroacetylacetonato ("hfac") compounds of aluminum, indium, gallium, barium, strontium and copper. The packing material may contain a stabilizing agent or may itself be a stabilizing agent.

The packing material may be any of a wide variety of shapes, such as beads, rods, tubes, horseshoes, rings, saddles, discs, saucers, or any other suitable form such as aciform, cruciform, and helicoids (coils and spirals). Packing materials are generally commercially available from a variety of sources. Although the packing material may be used as is, it is typically cleaned prior to use.

Packing material having a variety of sizes (e.g. diameters), such as 0.05 mm or greater, such as up to 5 mm or even larger may be used. A suitable range of sizes for the packing material is from 0.1 to 5 mm. The packing material may be of a uniform size or may be a mixture of sizes. In one embodiment, the size of the packing material is selected such that it is substantially the same as the particle size of the precursor compound, i.e. the mean size of the packing material is within 25% of the mean particle size of the precursor compound. Typically, the mean size of the packing material is within 20% of the particle size of the precursor compound, more typically within 15% and still more typically within 10%.

The precursor composition is typically prepared by introducing a layer of the solid precursor compound to the delivery device followed by depositing a layer of the packing material on the surface of the solid precursor compound layer. The solid precursor material may be added to the delivery device by any suitable means. Likewise, the packing material may be layered on the solid precursor compound by any suitable means. When the solid precursor compound is fritted, the packing material may be added prior to, during or after the fritting step. In alternate embodiment, the precursor composition is prepared by introducing both the solid precursor compound and the packing material to a delivery device followed by subjecting the delivery device to conditions which provide a bottom layer of solid precursor compound and a top layer of packing material. "Top layer" refers to the layer of material through which the carrier gas must first pass.

The volume ratio of solid precursor compound to packing material may vary over a wide range, such as from 10:1 to 1:10. Typically, the volume ratio is in the range of 1:4 to 4:1.

Any suitable carrier gas may be used with the present cylinders as long as it does not react with the precursor compound. The particular choice of carrier gas depends upon a variety of factors such, among others, as the precursor compound used and the particular chemical vapor deposition system employed. Suitable carrier gasses include, but are not limited to, hydrogen, nitrogen, argon, helium and the like. The carrier gas may be used with the present cylinders at a wide variety of flow rates. Such flow rates are a function of the cylinder cross-sectional dimension and pressure. Larger cross-sectional dimensions allow higher carrier gas flows, i.e. linear velocity, at a given pressure. For example, when the cylinder has a 5 cm cross-sectional dimension, carrier gas flow rates of up to 500 sccm and greater may be used. The carrier gas flow entering the cylinder, exiting the cylinder or both entering and exiting the cylinder may be regulated by a control means. Any conventional control means may be used, such as manually activated control valves or computer activated control valves.

The delivery device may be used at a variety of temperatures. The particular temperature will depend upon the particular precursor compound used and desired application. The temperature controls the vapor pressure of the precursor compound, which controls the flux of the material needed for specific growth rates or alloy compositions. Such temperature selection is well within the ability of one skilled in the art. For example, when the precursor compound is trimethyl indium, the temperature of the cylinder may be from 10 to 60° C. Other suitable temperature ranges include from 35 to 55° C., and from 35 to 50° C. The present cylinders may be heated by a variety of heating means, such as by placing the cylinder in a thermostatic bath, by direct immersion of the cylinder in a heated oil bath or by the use of a halocarbon oil flowing through a metal tube, such as a copper tube, surrounding the cylinder.

The carrier gas enters the cylinder through the gas inlet opening which is typically at the top of the cylinder. The carrier gas enters the inlet chamber and passes through the layer of packing material and then passes through the layer of solid precursor compound and picks up vaporized precursor compound to form a gas stream including vaporized precursor compound admixed with carrier gas. The amount of vaporized compound picked up by the carrier gas may be controlled. It is preferred that the carrier gas is saturated with vaporized precursor compound. The carrier gas exits the delivery device through the gas outlet opening and is directed to a chemical vapor deposition system. In the case of a dual-chambered delivery device, the carrier gas saturated with precursor compound passes from the inlet chamber to the outlet chamber, such as by passing through a porous element, and then exits the cylinder through the gas outlet opening. In one embodiment, the gas outlet is in a top closure portion. The delivery devices of the present invention may be used with any suitable chemical vapor deposition system.

After the solid precursor compound has been depleted from the cylinder, the packing material remains in cylinder. Such packing material may be recycled and reused. When the packing material includes a stabilizing agent, such as an oxygen scavenger, such packing material may be recycled and regenerated, if applicable, prior to reuse. Typically, all packing materials will be cleaned prior to reuse.

Figure 1:
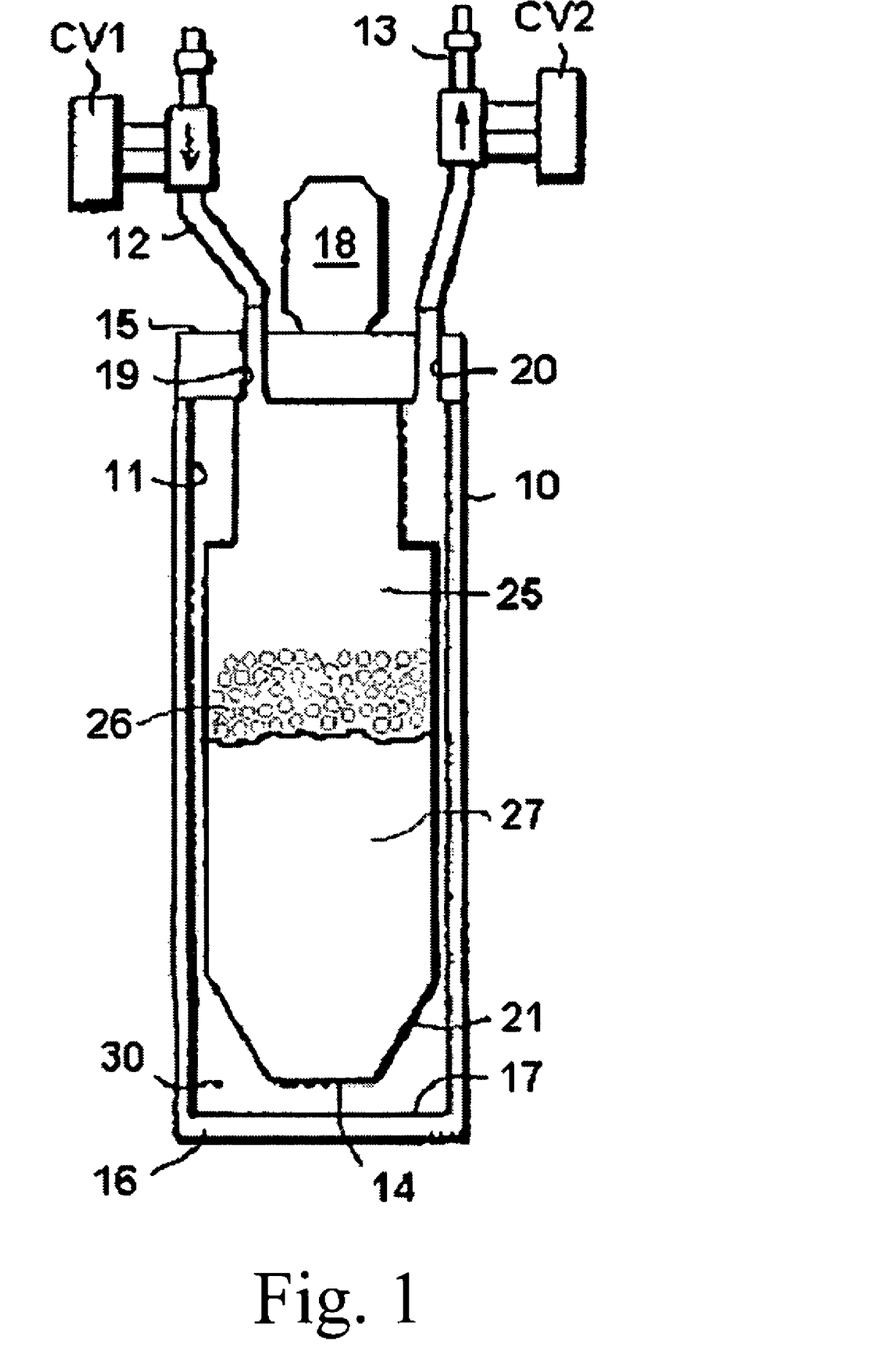
FIG. 1 is a cross-sectional view illustrative of a delivery device of the present invention having an annular design and a conical-shaped lower portion and containing solid precursor compound such as TMI having a layer of packing material disposed thereon.

Referring to the figures, like reference numerals refer to like elements. FIGS. 1-5 illustrate dual-chambered cylinders. FIG. 1 illustrates a cross-sectional view of a dual-chambered delivery device of the present invention having an annular design and a conical-shaped lower portion and containing a precursor composition including a solid precursor compound and a layer of packing material on the solid precursor compound. In this embodiment, an elongated cylindrical container 10 having an inner surface 11 defining a substantially constant cross-section throughout the length of cylinder 10, a top closure portion 15 and a bottom closure portion 16 having a flat inner bottom portion 17. Top closure portion 15 has fill port 18, inlet opening 19 and outlet opening 20. Inlet tube 12 and outlet tube 13 communicate with inlet opening 19 and outlet opening 20, respectively, in top closure portion 15 of the cylinder. Carrier gas flow entering the container through inlet tube 12 is regulated by control valve CV1. Carrier gas flow exiting the container through outlet tube 13 is regulated by control valve CV2. The lower end of the inlet opening 19 communicates directly with inlet chamber 25 having a conical shaped lower portion 21. Inlet chamber 25 and outlet chamber 30 are concentric, inlet chamber 25 being located within outlet chamber 30, and in fluid communication by means of porous element 14. Porous element 14 is located at the tip or bottom of the conical section 21 of the inlet chamber. Outlet opening 20 communicates directly with outlet chamber 30. A precursor composition including solid precursor compound 27 such as TMI and a layer of packing material 26 such as silica, borosilicate glass, or alumina on solid organometallic compound 27 is located within inlet chamber 25, the precursor composition being disposed on porous element 14.

Carrier gas enters the container through inlet tube 12 and into inlet chamber 25 containing the solid precursor compound/packing material composition. The carrier gas passes through the layer of packing material 26 and then passes through the solid precursor compound 27 and picks up vaporized precursor compound to form a gas stream. The gas stream exits the inlet chamber 25 through porous element 14 and enters outlet chamber 30. The gas stream then exits the outlet chamber 30 through outlet opening 20 into outlet tube 13 and then is directed into a chemical vapor deposition system.

Figure 2:
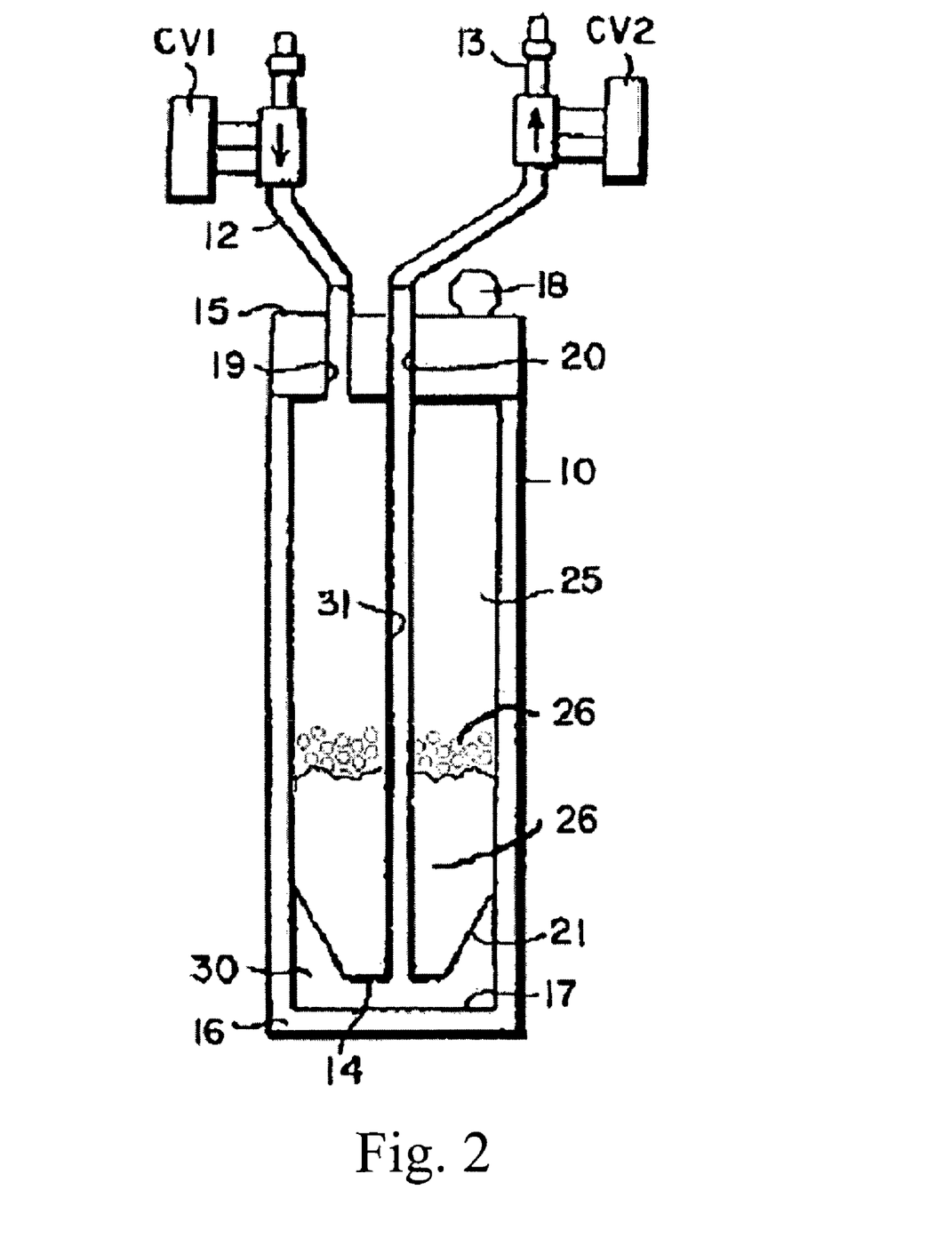
FIG. 2 is a cross-sectional view illustrative of a delivery device of the present invention having a non-annular design, and containing solid precursor compound having a layer of packing material disposed thereon.

FIG. 2 illustrates a cross-sectional view of a delivery device of the present invention having a non-annular design, and containing solid precursor compound having a layer of packing material disposed thereon. In this embodiment, an elongated cylindrical container 10 having an inner surface 11 defining a substantially constant cross-section throughout the length of cylinder 10, a top closure portion 15 and a bottom closure portion 16 having a flat inner bottom portion 17. Top closure portion 15 has fill port 18, inlet opening 19 and outlet opening 20. Inlet tube 12 and outlet tube 13 communicate with inlet opening 19 and outlet opening 20, respectively, in closure portion 15 of the container. Carrier gas flow entering the container through inlet tube 12 is regulated by control valve CV1. Carrier gas flow exiting the container through outlet tube 13 is regulated by control valve CV2. The lower end of the inlet opening 19 communicates directly with inlet chamber 25 having a center tube 31 concentric to its outer diameter and a conical shaped lower portion 21. Inlet chamber 25 and outlet chamber 30 are in fluid communication by means of porous element 14. Porous element 14 is located at the tip or bottom of the conical section 21 of the inlet chamber. Outlet opening 20 communicates with outlet chamber 30 by means of center tube 31. A precursor composition of solid precursor compound 27 such as TMI having a layer of packing material 26 such as alumina beads or silica beads disposed thereon is located within inlet chamber 25, the precursor composition being disposed on porous element 14.

Carrier gas enters the container through inlet tube 12 and into inlet chamber 25 containing the solid precursor compound/packing material composition. The carrier gas first passes through the layer of packing material 26 and then passes through the solid precursor compound 27 and picks up vaporized precursor compound to form a gas stream. The gas stream exits the inlet chamber 25 through porous element 14 and enters outlet chamber 30. The gas stream then passes through center tube 31 and exits the outlet chamber 30 through outlet opening 20 into outlet tube 13 and then is directed into a chemical vapor deposition system.

Figure 3:
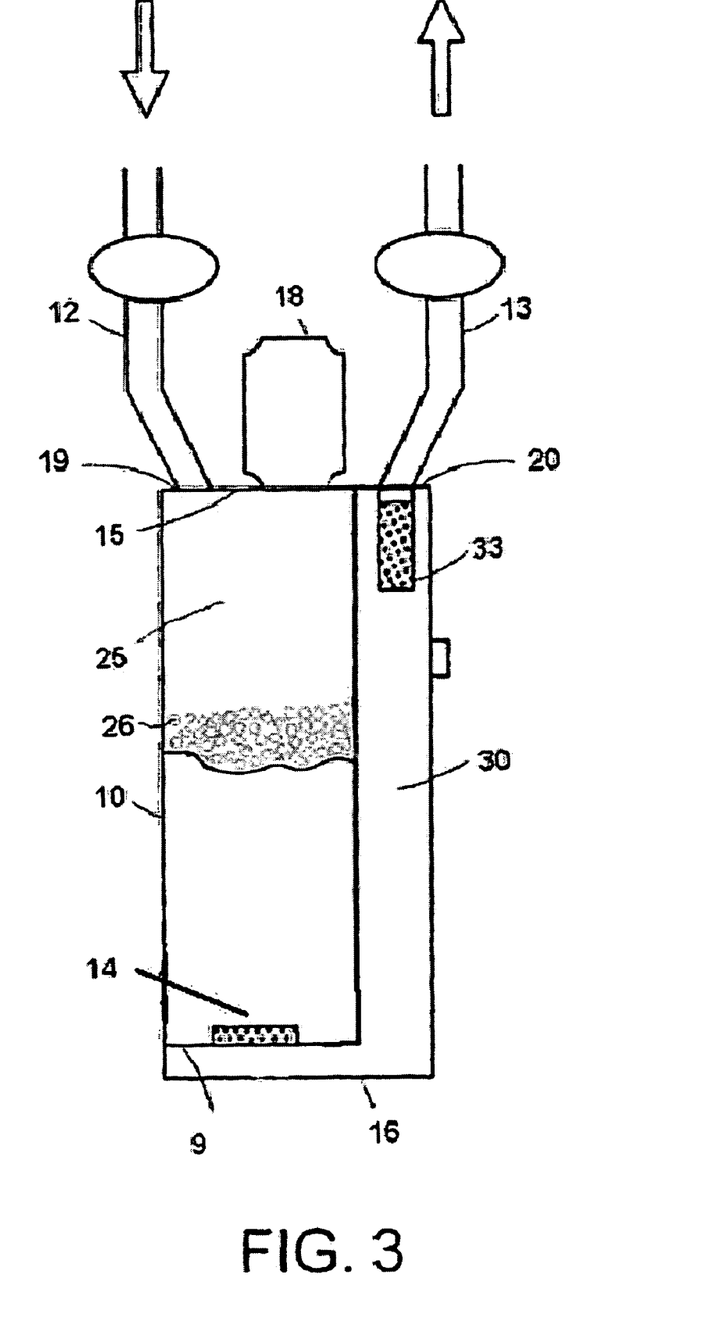
FIG. 3 is a cross-sectional view illustrative of a delivery device of the present invention having non-concentric inlet and outlet chambers and containing solid precursor compound having a layer of packing material disposed thereon.

A further embodiment is illustrated in FIG. 3 which is a cross-sectional view of a delivery device of the present invention having non-concentric inlet and outlet chambers and containing a solid precursor compound having a layer of packing material disposed thereon. In this embodiment, an elongated cylindrical container 10 having an inner surface defining a substantially constant cross-section throughout the length of cylinder 10, a top closure portion 15 and a bottom closure portion 16 having a flat inner bottom portion. Top closure portion 15 has fill port 18, inlet opening 19 and outlet opening 20. Inlet tube 12 and outlet tube 13 communicate with inlet opening 19 and outlet opening 20, respectively, in closure portion 15 of the container. Carrier gas flow entering the container through inlet tube 12 and exiting the container through outlet tube 13 are regulated by control valves. The arrows indicate the direction of gas flow. The lower end of the inlet opening 19 communicates directly with inlet chamber 25. Inlet chamber 25 and outlet chamber 30 are in fluid communication by means of porous element 14 located in inlet chamber floor 9. Outlet opening 20 communicates with outlet chamber 30. A second porous element 33 is located at outlet opening 20. A precursor composition including solid precursor compound 27, such as cyclopentadienyl magnesium, having a layer of packing material 26, such as silica, borosilicate glass, or alumina, is located within inlet chamber 25, the precursor composition being disposed on porous element 14.

Carrier gas enters the container through inlet tube 12 and into inlet chamber 25 containing the solid precursor compound/packing material composition. The carrier gas first passes through packing material 26 and then passes through solid precursor compound 27 and picks up vaporized precursor compound to form a gas stream. The gas stream exits the inlet chamber 25 through porous element 14 and enters outlet chamber 30. The gas stream then passes through second porous element 33 and exits the outlet chamber 30 through outlet opening 20 into outlet tube 13 and then is directed into a chemical vapor deposition system.

Figure 4:
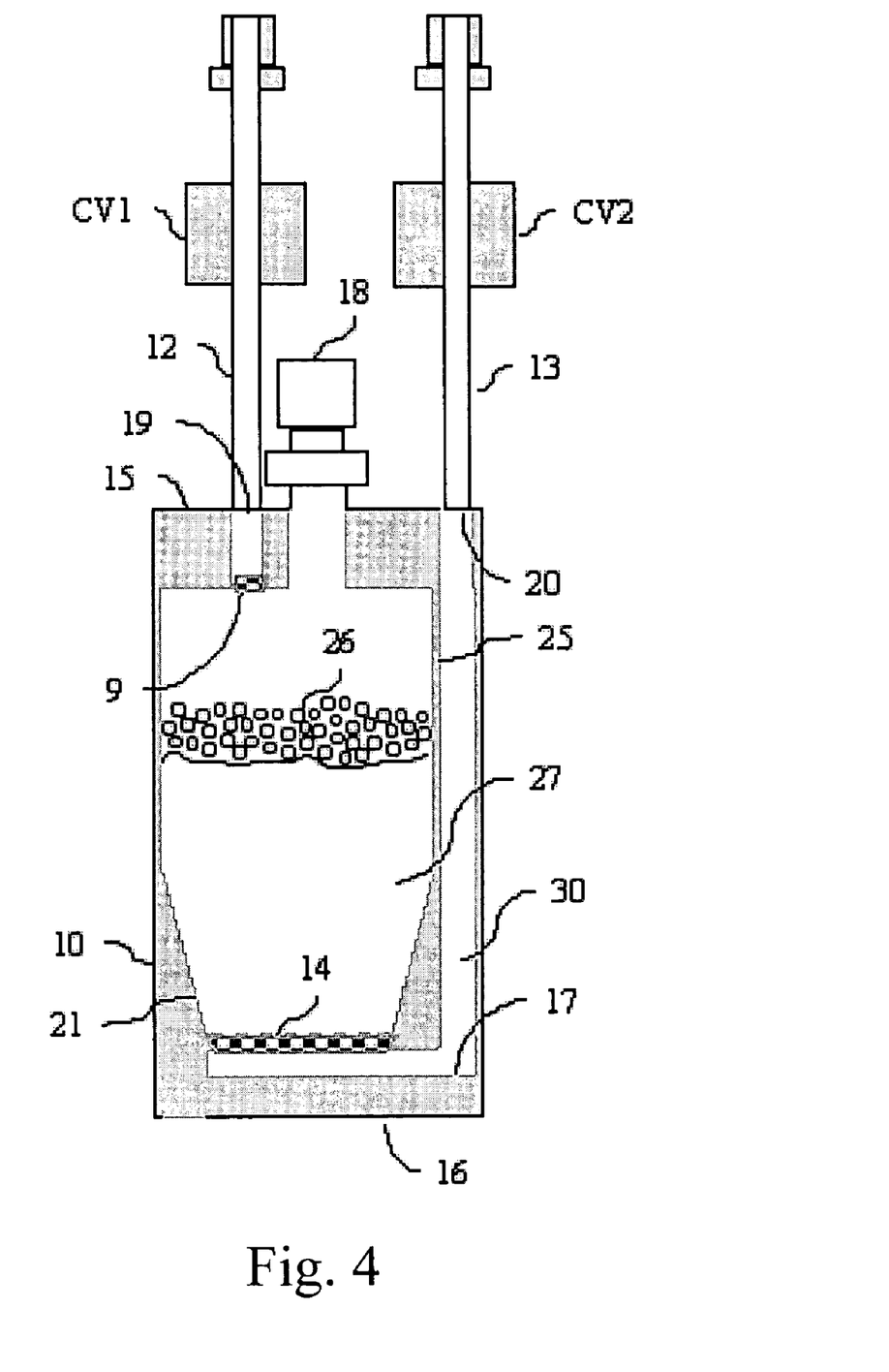
FIG. 4 is a cross-sectional view illustrative of a delivery device of the present invention having an non-annular design and a conical-shaped lower portion and containing solid precursor compound having a layer of packing material disposed thereon.

A further embodiment is shown in FIG. 4 which illustrates a cross-sectional view of a dual-chambered delivery device of the present invention having a conical-shaped lower portion and containing a precursor composition including a solid precursor compound and a layer of packing material on the solid precursor compound. In this embodiment, an elongated cylindrical container 10 has a top closure portion 15 and a bottom closure portion 16 having a flat inner bottom portion 17. Top closure portion 15 has fill port 18, inlet opening 19 and outlet opening 20. Inlet tube 12 and outlet tube 13 communicate with inlet opening 19 and outlet opening 20, respectively. Carrier gas flow entering the container through inlet tube 12 is regulated by control valve CV1. Carrier gas flow exiting the container through outlet tube 13 is regulated by control valve CV2. The lower end of the inlet opening 19 contains inlet porous element 9 and communicates directly with inlet chamber 25 having a conical shaped lower portion 21. Inlet chamber 25 and outlet chamber 30 are in fluid communication by means of porous element 14. Porous element 14 is located at the tip or bottom of the conical section 21 of the inlet chamber. Outlet opening 20 communicates directly with outlet chamber 30. A precursor composition including solid precursor compound 27 such as TMI and a layer of packing material 26 such as silica, borosilicate glass, or alumina on solid precursor compound 27 is located within inlet chamber 25.

Carrier gas enters the container through inlet tube 12, passes through inlet porous element 9 and into inlet chamber 25 containing the solid precursor compound/packing material composition. The carrier gas passes through the layer of packing material 26 and then passes through the solid precursor compound 27 and picks up vaporized precursor compound to form a gas stream. The gas stream exits the inlet chamber 25 through porous element 14 and enters outlet chamber 30. The gas stream then exits the outlet chamber 30 through outlet opening 20 into outlet tube 13 and then is directed into a chemical vapor deposition system.

Figure 5:
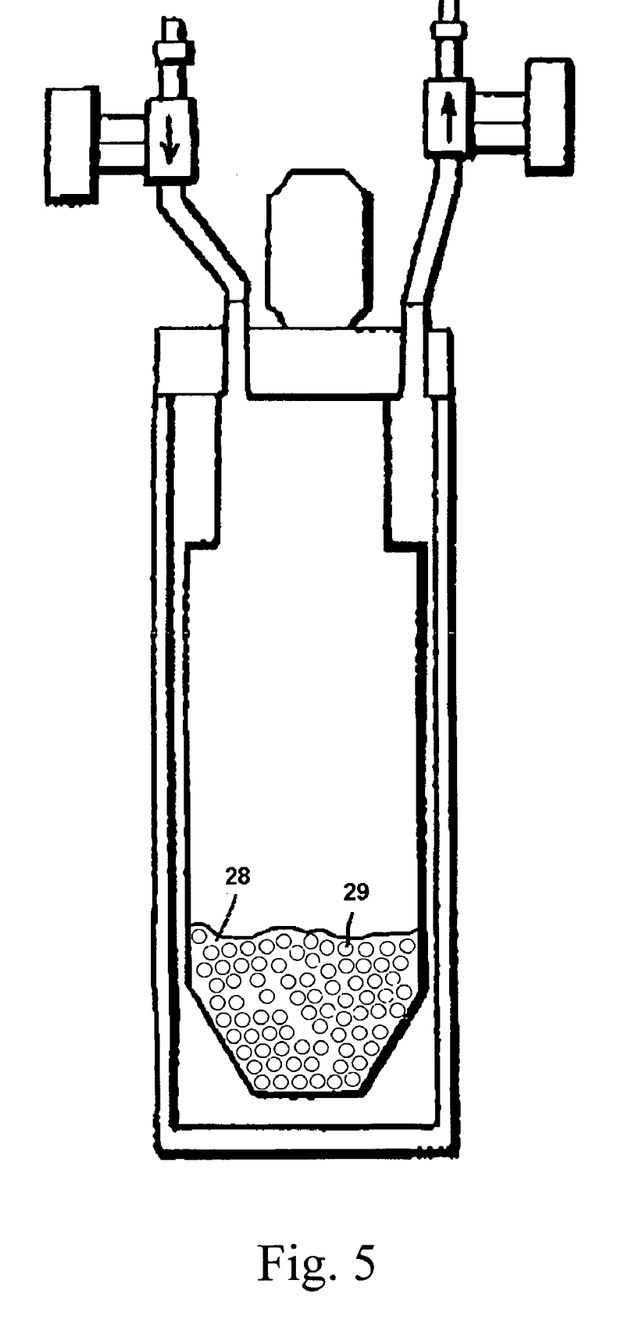
FIG. 5 is a cross-sectional view of a delivery device including a precursor composition including solid precursor compound and a packing material including a stabilizing agent.

In an alternate embodiment, the packing material includes a stabilizing agent such as an oxygen scavenger. When the packing material is a stabilizing agent, the layer of packing material may dry and/or purify (e.g. remove oxygen) the carrier gas before the carrier gas contacts the solid precursor compound. Additional benefits can be obtained from intermixing the packing material with the solid precursor compound. For example, intermixing of a solid precursor compound and an oxygen scavenging packing material provides increased contact between the vapor/gas stream and the packing material which increases the ability of the packing material to scavenge oxygen from the precursor compound. FIG. 5 illustrates one embodiment of a delivery device containing an intermixed composition including a solid precursor compound 28 and a stabilizing agent packing material 29. The remaining reference numerals in FIG. 5 refer to the same elements as in FIG. 1.

Accordingly, the present invention provides a method of providing a fluid gas stream composed of a carrier gas saturated with precursor compound to a chemical vapor deposition system including the steps of: a) providing the delivery device described above, wherein the delivery device has a gas inlet and a gas outlet; b) introducing a carrier gas into delivery device through the gas inlet; c) flowing the carrier gas through the packing material and the solid precursor compound to substantially saturate the carrier gas with the precursor compound; and d) the compound saturated carrier gas exiting from the delivery device through the gas outlet. Typically, the carrier gas is at a sufficient flow rate to pass through the packing material and precursor compound such that the carrier gas contains a sufficient amount of precursor compound in the vapor phase, i.e. substantially saturated, to be used in film growth in a CVD reactor.

In another embodiment, the present invention provides a method of providing a fluid gas stream composed of a carrier gas saturated with precursor compound to a chemical vapor deposition system including the steps of: a) providing a the delivery device described above, wherein the delivery device has a gas inlet and a gas outlet; b) introducing a carrier gas into the inlet chamber through the gas inlet opening; c) flowing the carrier gas through the layer of packing material and contacting the solid precursor compound to substantially saturate the carrier gas with the precursor compound; d) the precursor compound saturated carrier gas exiting from the inlet chamber through the porous element in the floor of the inlet chamber into the outlet chamber; and e) directing the precursor compound saturated carrier gas to exit the outlet chamber through the outlet opening.

A chemical vapor deposition system includes a deposition chamber, which is typically a heated vessel within which is disposed at least one, and possibly many, substrates. The deposition chamber has an outlet, which is typically connected to a vacuum pump in order to draw by-products out of the chamber and to provide a reduced pressure where that is appropriate. MOCVD can be conducted at atmospheric or reduced pressure. The deposition chamber is maintained at a temperature sufficiently high to induce decomposition of the vaporized precursor compound. The typical deposition chamber temperature is from 300 to 1000° C., the exact temperature selected being optimized to provide efficient deposition. Optionally, the temperature in the deposition chamber as a whole can be reduced if the substrate is maintained at an elevated temperature, or if other energy such as radio frequency ("RF") energy is generated by an RF source.

Exemplary substrates for deposition, in the case of electronic device manufacture, may be silicon, gallium arsenide, and indium phosphide. Substrates including other materials may also be suitably used. Such substrates are particularly useful in the manufacture of integrated circuits.

Deposition is continued for as long as desired to produce a metal film having the desired properties. Typically, the film thickness will be from several hundred to several thousand angstroms or more when deposition is stopped.

Also provided by the present invention is a method of depositing a film including the steps of: a) providing the delivery device described above, wherein the delivery device has a gas inlet and a gas outlet; b) introducing a carrier gas into the delivery device through the gas inlet; c) flowing the carrier gas through the packing material and the solid precursor compound to substantially saturate the carrier gas with the precursor compound; d) the precursor compound saturated carrier gas exiting from the delivery device through the gas outlet; e) delivering the precursor compound saturated carrier gas to a reaction vessel containing a substrate; and f) subjecting the precursor compound saturated carrier gas to conditions sufficient to decompose the precursor compound to form a film on the substrate In yet another embodiment, the present invention provides a method of depositing a film including the steps of: a) providing a dual-chambered vessel having an elongated cylindrical shaped portion, a top closure portion, a bottom closure portion, and inlet and outlet chambers in fluid communication and separated by a porous element in a floor of the inlet chamber, the top closure portion having a fill plug and a gas inlet opening, the fill plug and gas inlet opening communicating with the inlet chamber, an outlet opening communicating with the outlet chamber, the porous element being spaced apart from the bottom closure portion, the inlet chamber having a floor, and a precursor composition contained within the inlet chamber, the precursor composition including a solid precursor compound and a layer of a packing material disposed on the solid precursor compound; b) introducing a carrier gas into the inlet chamber through the gas inlet opening; c) flowing the carrier gas through the layer of packing material and contacting the solid precursor compound to substantially saturate the carrier gas with the precursor compound; d) the compound saturated carrier gas exiting from the inlet chamber through the porous element in the floor of the inlet chamber into the outlet chamber; e) directing the precursor compound saturated carrier gas to exit the outlet chamber through the outlet opening; f) delivering the precursor compound saturated carrier gas to a reaction vessel containing a substrate; and g) subjecting the precursor compound saturated carrier gas to conditions sufficient to decompose the precursor compound to form a film on the substrate.

While the present invention may be used at a variety of system pressures, an advantage of the present invention is that higher flow rates, higher temperatures, lower pressures or a combination of higher flow rates and lower pressures may be used, particularly for cylinders having a diameter of $\leq 10$ cm. The delivery devices of the present invention have the additional advantage of providing uniform carrier gas with consistent maximum saturation that flows through the packed solid precursor compound/packing material layered composition.

The following examples are expected to illustrate further various aspects of the present invention.

COMPARATIVE EXAMPLE

A 5 cm (2 inch) diameter cylinder as shown in FIG. 1 was charged with 175 g of TMI. No packing material was added to the cylinder. The cylinder was attached to an EPISON III instrument (available from Thomas Swan) which measures the concentration of a material in a gas stream as a function of time. The cylinder was maintained at 30° C. and at a pressure of 80 kPa (600 mm Hg) and a carrier gas (hydrogen) flow rate of 400 sccm. The concentration of TMI in the fluid stream was measured at 2 minute intervals over a 140 hour period. Both the flow rate and pressure were constant during the course of the evaluation. The concentration of TMI in the vapor phase started to drop below the saturation level after approximately 140 hours, at which time about 70 g of TMI remained in the cylinder which corresponds to about 60% depletion.

EXAMPLE 1

TMI (100 g) was added to a 5 cm (2 inch) UNI-FLO™ cylinder (Rohm and Haas Electronic Materials LLC). The TMI was ground to a fine powder prior to addition to the cylinder. The cylinder was agitated by gently tapping the cylinder on a hard surface at room temperature to provide a substantially level surface. The TMI was then fritted by allowing the cylinder to stand overnight (approximately 12 hours) at 30° C. in a constant temperature bath. Freshly cleaned dry quartz filler (0.3 mm diameter, 145 g) was disposed as a top layer on the fritted TMI.

A testing apparatus consisting of a mass flow controller, pressure controller, EPISON™ ultrasonic module, constant temperature bath, vacuum pump and associated valves and piping was constructed to measure flow stability and saturated vapor flow. The cylinder was installed in the system. The constant temperature bath was maintained at 30° C., the system pressure was maintained at 80 kPa (600 mm Hg), and a hydrogen carrier gas flow was maintained at 400 sccm. Both the flow rate and pressure were constant during the course of the evaluation. A stable concentration of TMI vapor in hydrogen was maintained for over 120 hours, as measured by the ultrasonic monitor. At 120 hours, 12 g of TMI remained in the cylinder which corresponds to 88% depletion.

EXAMPLE 2

The procedure of Example 1 is repeated except that the TMI is first ground to a substantially uniform size of 3-4 mm. A constant particle size is ensured by passing the TMI powder though precision sieves. Material that passed a #5 sieve but retained in a #7 sieve is transferred to the cylinder. The cylinder is heated to about 45° C. to form a solid frit of TMI. Using similar conditions of Example 1, similar results are expected to be obtained.

EXAMPLE 3

The procedure of Example 1 is repeated except that two particle sizes are introduced to the cylinder. A #8 and #10 sieve are used to collect particles of size range 2-2.4 mm. #45 and #70 sieves are used to collect particle sizes 0.2-0.4 mm. Equal amounts of each particle size are mixed prior to introduction into the cylinder that is attached to the system as described in Example 1. The cylinder and its contents are then subjected to the conditions used in Example 1, and similar results are expected.

EXAMPLE 4

The procedure of Example 1 is repeated except that two particle sizes are introduced to the cylinder in alternating layers. A #8 and #10 sieve are used to collect particles of size range 2-2.4 mm. #45 and #70 sieves are used to collect particle sizes 0.2-0.4 mm. Equal amounts of each particle size are then introduced into the cylinder in alternating layers. The cylinder that is attached to the system as described in Example 1, and a stable concentration of TMI vapor is expected.

EXAMPLE 5

The procedure of Example 4 is repeated except that bis(cyclopentadienyl)magnesium is used as the solid precursor compound frit. A stable concentrations of bis(cyclopentadienyl)magnesium vapor is expected in the vapor phase.

EXAMPLE 6

The procedure of Example 4 is repeated except that carbon tetrabromide is used as the solid precursor compound. A stable concentration of carbon tetrabromide vapor is expected at 25° C.

EXAMPLE 7

The procedure of Example 1 is repeated except the constant temperature bath is maintained at 17° C., the system pressure is maintained at 40 kPa (300 mm Hg), and a hydrogen carrier gas flow is maintained at 600 sccm. A stable concentration of TMI vapor in hydrogen is expected to be maintained, as measured by the ultrasonic monitor.

EXAMPLES 8-25

The procedure of Example 1 is repeated except that the following solid precursor compounds ("PC") and packing materials ("PM") are used. Whether the solid organometallic compounds are fritted is indicated in the following table, "Y"=yes and "N"=no.

| Example | Precursor Compound | PC Fritted | Packing Material (particle size) | Volume Ratio of PC:PM |
|---|---|---|---|---|
| 8 | TMI | Y | Silica (0.25 mm) | 1:1 |
| 9 | TMI | N | Silica (0.75 mm) | 1:1.1 |
| 10 | TMI | Y | Alumina beads (0.5 mm) | 1.2:1 |
| 11 | TMI | N | Silica beads (1 mm) | 1.5:1 |
| 12 | TMI | Y | PTFE beads (0.75 mm) | 1.3:1 |
| 13 | Cp$_2$Mg | Y | HDPE saddles (0.75 mm) | 1:1.1 |
| 14 | Cp$_2$Mg | Y | PYREX™ rings (1.25 mm) | 1.25:1 |
| 15 | Cp$_2$Mg | N | PYREX™ coils (1.5 mm) | 2:1 |
| 16 | Dimethyl chloroindium | Y | Alumina beads (0.5 mm) | 1.1:1 |
| 17 | Dimethyl chloroindium | N | Silica rings (1 mm) | 1.2:1 |
| 18 | Cyclopentadienyl indium | N | PTFE beads (0.6 mm) | 1:1 |
| 19 | Cyclopentadienyl indium | Y | alumina tubes (1.2 mm) | 1.2:1 |
| 20 | Cyclopentadienyl zinc | N | Silica tubes (0.4 mm) | 1.1:1 |
| 21 | Tetrakis(dimethylamino)hafnium | Y | Borosilicate rings (0.5 mm) | 1.3:1 |
| 22 | TMI - trimethyl arsine adduct | N | Alumina rods (1 mm) | 1:1.2 |
| 23 | TMI - trimethyl phosphine adduct | N | PTFE discs (0.8 mm) | 1.3:1 |
| 24 | Carbon tetrabromide | Y | borosilicate beads (0.5 mm) | 1.3:1 |
| 25 | Alane-trimethyl amine adduct | N | glass beads (0.75 mm) | 1:1 |

The compositions in the Table are expected to provide consistent, stable vapor phase concentrations of precursor compound for extended periods, as compared to systems where packing materials are used.

EXAMPLE 26

The procedure of Example 1 was repeated to determine the effect of the layer of packing material on the depletion of TMI. Each cylinder was charged with TMI as reported in the following table. Cylinders that did not contain a top layer of quartz packing material (Tests I-IV) were comparative tests. The cylinders used in tests V-VII each contained a layer of quartz packing material on the surface of the solid organometallic compound. Each cylinder was maintained at constant temperature of 30° C. and at system pressure of 80 kPa. The results are reported in the Table below and show considerable improvement in the depletion of TMI with the addition of a top layer of packing material.

| Test Number | Flow Rate (sccm) | Depletion Time (Hrs) | TMI Initial Loading (g) | Layer of Quartz Packing Material | Amount of TMI Depleted (g) | % Depletion |
|---|---|---|---|---|---|---|
| I* | 400 | 164 | 175 | No | 119 | 68 |
| II* | 400 | 140 | 175 | No | 100 | 57 |
| III* | 400 | 70 | 90 | No | 47 | 52 |

-continued

| Test Number | Flow Rate (sccm) | Depletion Time (Hrs) | TMI Initial Loading (g) | Layer of Quartz Packing Material | Amount of TMI Depleted (g) | % Depletion |
|---|---|---|---|---|---|---|
| IV* | 400 | 175 | 175 | No | 122 | 70 |
| V | 400 | 122 | 100 | Yes | 92 | 92 |
| VI | 800 | 120 | 200 | Yes | 194 | 97 |
| VII | 800 | 140 | 250 | Yes | 222 | 89 |

*= Comparative

What is claimed is:

1. A vapor phase delivery device for solid precursor compounds comprising an outlet chamber and an inlet chamber comprising a precursor composition comprising a single layer of solid precursor compound and a single layer of packing material disposed on the solid precursor compound.

2. The vapor phase delivery device of claim 1 wherein the solid precursor compound is chosen from: trialkyl indium compounds; trialkyl indium-amine adducts; dialkyl haloindium compounds; alkyl dihaloindium compounds; cyclopentadienyl indium; trialkyl indium-trialkyl arsine adducts; trialkyl indium-trialkyl-phosphine adducts; alkyl zinc halides; cyclopentadienyl zinc; ethylcyclopentadienyl zinc; alkyl dihaloaluminum compounds; alane-amine adducts; alkyl dihalogallium compounds; dialkyl halogallium compounds; biscyclopentadienyl magnesium; silicon compounds; germanium compounds; carbon tetrabromide; metal dialkylamides; and metal beta-diketonates.

3. The vapor phase delivery device of claim 1 wherein the packing material is chosen from ceramics, glasses, clays and organic polymers.

4. The vapor phase delivery device of claim 1 having an elongated cylindrical shaped portion, a top closure portion, a bottom closure portion, and the inlet and the outlet chambers in fluid communication and separated by a porous element, the top closure portion having a fill plug and a gas inlet opening, the fill plug and gas inlet opening communicating with the inlet chamber, an outlet opening communicating with the outlet chamber, the porous element being spaced apart from the bottom closure portion, the porous element contained in a floor of the inlet chamber, and the precursor composition being contained within the inlet chamber.

5. The vapor phase delivery device of claim 1 wherein the solid precursor compound is fitted.

6. The vapor phase delivery device of claim 1 wherein the delivery device does not contain a dip tube.

7. A method of depositing a film comprising the steps of: a) providing a vapor phase delivery device comprising an outlet chamber and an inlet chamber comprising a precursor composition comprising a single layer of a solid precursor compound and a single layer of packing material disposed on the solid precursor compound, wherein the delivery device has a gas inlet and a gas outlet; b) introducing a carrier gas into the delivery device through the gas inlet; c) flowing the carrier gas through the layer of packing material and then through the layer of solid precursor compound to substantially saturate the carrier gas with the precursor compound; d) the precursor compound saturated carrier gas exiting from the delivery device through the gas outlet; e) delivering the precursor compound saturated carrier gas to a reaction vessel containing a substrate; and f) subjecting the precursor compound saturated carrier gas to conditions sufficient to decompose the precursor compound to form a film on the substrate.

8. The method of claim 7 wherein the delivery device further comprises an elongated cylindrical shaped portion, a top closure portion, a bottom closure portion, and the inlet and the outlet chambers in fluid communication and separated by the porous element, the top closure portion having a fill plug and a gas inlet opening, the fill plug and gas inlet opening communicating with the inlet chamber, an outlet opening communicating with the outlet chamber, the porous element being spaced from the bottom closure portion, the porous element contained in a floor of the inlet chamber, and the precursor composition being contained within the inlet chamber.

9. The method of claim 7 wherein the packing material comprises a stabilizing agent.

10. The method of claim 9 wherein the stabilizing agent is chosen from oxygen scavengers, thermal stabilizers, antioxidants, anti-static agents, free-radical scavengers, and tagging agents.

11. The method of claim 7 wherein the packing material is chosen from ceramics, glasses, clays and organic polymers.

12. The method of claim 11 wherein the packing material is chosen from alumina, silica, silicon carbide, silicon nitride, borosilicates, and alumina silicates.

13. The method of claim 7 wherein the solid precursor compound is chosen from: trialkyl indium compounds; trialkyl indium-amine adducts; dialkyl haloindium compounds; alkyl dihaloindium compounds; cyclopentadienyl indium; trialkyl indium-trialkyl arsine adducts; trialkyl indium-trialkyl-phosphine adducts; alkyl zinc halides; cyclopentadienyl zinc; ethylcyclopentadienyl zinc; alkyl dihaloaluminum compounds; alane-amine adducts; alkyl dihalogallium compounds; dialkyl halogallium compounds; biscyclopentadienyl magnesium; silicon compounds; germanium compounds; carbon tetrabromide; metal dialkylamides; and metal beta-diketonates.

* * * * *